United States Patent
Vig et al.

[19]

[11] Patent Number: 6,100,680
[45] Date of Patent: Aug. 8, 2000

[54] DETECTING THE PASSING OF MAGNETIC ARTICLES USING A TRANSDUCER-SIGNAL DETECTOR HAVING A SWITCHABLE DUAL-MODE THRESHOLD

[75] Inventors: Ravi Vig, Bow; Jay M. Towne, Newbury; P. Karl Scheller, Rochester, all of N.H.

[73] Assignee: Allegro Microsystems, Inc., Worcester, Mass.

[21] Appl. No.: 08/851,402

[22] Filed: May 5, 1997

Related U.S. Application Data

[63] Continuation-in-part of application No. 08/587,406, Jan. 17, 1996, Pat. No. 5,694,038.

[51] Int. Cl.[7] .......................... G01P 3/488; G01P 3/489; H03K 5/08; H03K 5/153
[52] U.S. Cl. ................ 324/207.2; 324/166; 324/207.25; 324/207.26; 324/251; 327/14; 327/59; 327/62; 327/511
[58] Field of Search .................................. 324/166, 173, 324/174, 207.12, 207.2, 207.21, 207.25, 207.26, 235, 251, 252; 307/116; 327/510, 511, 14, 15, 59, 62, 94–96

[56] References Cited

U.S. PATENT DOCUMENTS

| | | | |
|---|---|---|---|
| 4,908,527 | 3/1990 | Van Antwerp et al. | 324/251 X |
| 5,442,283 | 8/1995 | Vig et al. | 324/207.2 |
| 5,459,398 | 10/1995 | Hansen et al. | 324/166 |
| 5,477,142 | 12/1995 | Good et al. | 324/166 |
| 5,487,595 | 1/1996 | Wise et al. | 324/166 X |
| 5,493,219 | 2/1996 | Makino et al. | 324/207.25 |
| 5,497,084 | 3/1996 | Bicking | 324/166 X |

*Primary Examiner*—Gerard Strecker

[57] ABSTRACT

A magnetic-field-to-voltage transducer includes a Hall element and a digitally gain-controlled Hall-voltage amplifier that produces an analog signal voltage Vsig having excursions of one polarity corresponding to the passing of magnetic articles. The gain of an AGC Vsig amplifier is only decreased in small sequential gain increments during an initial interval defined as that in which two excursions in Vsig have occurred, and the gain remains unchanged thereafter. Vsig is applied to the input of a peak-referenced-threshold signal detector that generates a binary output voltage, Vout, having transitions of one direction and the other direction corresponding respectively to the approach and retreat of the passing articles. The peak-referenced-threshold signal detector includes a dual-threshold-voltage comparator which is set to a large threshold at start-up. When just after start-up an excursion in the signal Vsig at the output of the amplifier exceeds a predetermined reference voltage, a small threshold obtains. Such an automatic threshold adjustment is made only in a brief initial period following start-up and not again until the proximity detector has been powered down and then started up again. This automatic dual-mode threshold feature prevents false detection due to "overshoots" that may be present in the transducer signal when the air gap is small, and leads to accurate detection over a wide range of air gaps between the transducer and the passing magnetic articles.

6 Claims, 8 Drawing Sheets

DETECTING THE PASSING OF MAGNETIC ARTICLES USING A TRANSDUCER-SIGNAL DETECTOR HAVING A SWITCHABLE DUAL-MODE THRESHOLD

CROSS REFERENCES TO RELATED APPLICATIONS

This is a continuation in part of Ser. No. 08/587,406, filed Jan. 17, 1996, now U.S. Pat. No. 5,694,038 issued Dec. 2, 1997.

BACKGROUND

This invention relates to a proximity detector, and especially to a ferrous-gear-tooth Hall-transducer, or other magnetic-field-to-voltage transducer, capable of detecting the leading and trailing gear tooth edges of an adjacent rotating ferrous gear, or other magnetic articles, and more particularly relates to such a Hall proximity detector having a transducer-signal detector with a dual-mode hysteresis feature.

The term "magnetic article" as used herein applies to magnetized bodies, ferrous bodies and other bodies having a low magnetic reluctance that tend to alter the ambient magnetic field.

Conventional proximity detectors have consisted of a transducer, e.g. a Hall element, and a transducer-signal detector which produces a binary output (Vout) having transitions corresponding to predetermined points on the excursions in the transducer-voltage signal ($V_H$).

The most common type of transducer-signal detector has been the transducer-signal mid-signal detector. A mid-signal detector is one that includes a comparator having hysteresis and includes other circuitry which biases the center of the comparator-hysteresis loop at a level corresponding to approximately the middle of the transducer signal.

Such simple mid-signal detectors are employed in the proximity detectors described in the U.S. Pat. No. 4,374,333 issued Feb. 15, 1983, U.S. Pat. No. 4,443,716 issued Apr. 17, 1987 and U.S. Pat. No 4,705,964 issued Nov. 10, 1987. In the mid-signal detector, the points in the positive and negative signal-excursions at which the binary output signal transitions occur are determined by the voltage thresholds of the Schmitt circuit hysteresis. In U.S. Pat. No. 5,650,719 issued Jul. 22, 1997 a mid-signal peak-to-peak-percentage-threshold detector is used and the thresholds are updated periodically to be a predetermined percentage of the peak to peak voltage of the transducer signal.

In the U.S. Pat. No. 5,442,283, issued Aug. 15, 1995, and assigned to the same assignee as is the present application, there is described a Hall-voltage proximity-detector capable of detecting the approach and retreat of an adjacent rotating gear tooth. This proximity-detector includes an integrated circuit including a Hall element and Hall-signal peak-referenced-threshold detector mounted to a pole of a magnet. This peak-referenced-threshold detector is a circuit for tracking a slope of a Hall voltage and briefly holding the ensuing peak Hall voltage until the Hall voltage falls away from the held peak by a predetermined voltage (threshold), at which time a transition is caused to occur in the binary output signal of the detector indicating the approach (or retreat) of a magnetic article.

The proximity detector described in U.S. Pat. No. 5,694,038 issued Dec. 2, 1997, entitled DETECTION OF MAGNETIC ARTICLES WITH AUTOMATIC GAIN CONTROL, also includes a Hall signal detector of the peak-referenced-threshold type, as does the proximity detector of the present invention.

Proximity detectors of either type in the prior art produce a high binary output voltage having positive and negative going binary transitions indicating approach and retreat of a passing article. A peak-referenced-threshold type signal detector, similar to that in the above-noted U.S. Pat. No. 5,442,283, is described in the U.S. Pat. No. 5,729,103 issued Mar. 17, 1998 that is entitled DETECTION OF MAGNETIC ARTICLES AT SPEEDS DOWN TO ZERO. All three of the fore-mentioned patents U.S. Pat. No. 5,650,719, U.S. Pat. No. 5,694,038 and U.S. Pat. No. 5,729,130 are assigned to the same assignee as is the present invention.

Prior art proximity detectors use Hall signal detectors of the mid-signal or peak-referenced-threshold types. These detectors have a fixed threshold voltage, and produce low to high (or high to low) binary transitions in the output signal indicating approach of a passing magnetic article.

In practice the closest passing distance, sometimes referred to as the air gap, does not remain constant during a given detection period, or during the life of the detector. And of course identical detectors are never installed so that the air gap is always the same from installation to installation. The amplitude of the signal voltage from the magnetic-field-to-voltage transducer used in proximity detectors is a strong inverse function of the air gap, and thus the range of air gap dimensions over which a prior art proximity detector can properly operate is severely limited.

Changes in the air gap, between the transducer and the passing articles, may be attributable to the instability of the path of the passing magnetic articles, e.g. degree of eccentricity of rotating gear teeth, or the degree to which the articles have been identically positioned on a passing conveyer belt.

But of greatest concern for detecting the passing of magnetic articles, is the mounting of proximity detectors adjacent to rotating gears at air gap spacings that vary from installation to installation. This leads to inaccuracies of article detection, which is especially distressing when used in critical applications such as in combustion engine ignition systems.

Detection accuracy, as used herein is meant to refer primarily to the degree of consistency in the correspondence of the timing of the signal detector output transition to the time when the approach (or retreat) distance between the Hall element and a passing article is one particular distance. Detection accuracy of course also includes the absence of false detection indications of passing article approaches or retreat.

It is an object of this invention to provide a proximity detector, that generates transitions in the detector binary output voltage which transitions accurately correspond to consistent points of approach and retreat of passing magnetic articles over a wide range of air gap dimensions.

It is another object of this invention to provide such a proximity detector for preventing a false detection indication due to switching on a trailing overshoot portion of an excursion in the waveform of the transducer voltage.

It is a further object of this invention to provide such a proximity detector that at start-up quickly switches from a high to a low detection threshold when the transducer voltage exceeds a predetermined reference voltage so that excepting for only the first one or two passing articles at start-up, the accuracy of detection will be improved during the following detection session, until detection is stopped and restarted again.

SUMMARY OF THE INVENTION

A proximity-detection method for detecting the passing of magnetic articles includes employing a magnetic-field-to-voltage transducer near the passing magnetic articles, sensing the ambient magnetic field and applying the output voltage from the transducer $V_H$ to an amplifier. The amplified signal is designated Vsig. A binary proximity-detector output voltage Vout is produced by generating a track-and-hold signal voltage, $V_{t\&h}$, that tracks each slope portion of Vsig until a peak excursion is reached and holds the peak excursion voltage until at a time $t_x$ the difference voltage, $V_{dif}$, between Vsig and $V_{t\&h}$ reaches the threshold voltage of a switchable dual-threshold signal detector, and at successive times $t_x$ produces the successive binary transitions in Vout. An initial interval after starting the proximity detection is defined as that in which only the first positive and first negative excursions in Vsig transpire. At start-up, the dual-threshold signal detector is set to the larger $V_{thB}$ of the two threshold voltages.

When during the initial interval, the excursion of one polarity in Vsig becomes greater than the predetermined reference voltage ($V_{HI}$), the dual-threshold signal detector is switched to the smaller $V_{thA}$ of the two threshold voltages where it preferably remains for the duration of the detecting.

However, when during the initial interval the excursion of one predetermined polarity in Vsig does not become greater than a predetermined reference voltage ($V_{HI}$), then in a second interval during which two more excursions in Vsig have transpired, the dual-threshold signal detector is switched to the smaller $V_{thA}$ of the two threshold voltages.

The gain of the amplifier is changed in the direction to bring the peak values of at least one polarity in Vsig to a predetermined target value ($V_{HI}$). This changing of the gain is fully accomplished within the initial interval after start-up when the first excursion in Vsig of the one polarity exceeds the target value. This is accomplished by setting the initial gain of the amplifier to a maximum gain value at the moment of start-up and during the initial interval after start-up, decreasing the amplifier gain until the peak value of the first excursion of at least one polarity in Vsig is brought to a predetermined target value ($V_{HI}$). During a subsequent interval to the initial interval that an excursion of the one polarity exceeds the target value, another AGC action ensues to further drop the gain. It is preferred that such subsequent interval be limited to that immediately following the initial interval and that the subsequent interval endure no longer than 150 binary transitions in the detector output signal, Vout.

More particularly, the fast automatic gain control function is accomplished by decreasing the gain of the amplifier by predetermined gain increments at a rate more than an order of magnitude greater than the frequency of the excursions in Vsig until that first peak is flattened to essentially equal the reference voltage ($V_{HI}$). Such predetermined gain increments are preferably less than ten percent of the maximum gain of the AGC amplifier.

BRIEF DESCRIPTION OF THE DRAWINGS

FIG. 2 shows the waveform of a positive peak portion of Vsig during which automatic gain control (AGC) is effected.

FIG. 3 shows a waveform of the binary signal Vbig in the AGC circuit.

FIG. 4 shows the waveform of the binary signal Vclk in the AGC circuit.

FIG. 5 shows the waveform of the binary signal $V_R$ in the AGC circuit.

FIG. 6 shows the count in counter 118 which sets the gain of digitally controllable amplifier 110 for successive intervals during automatic gain control.

FIG. 17 shows the first few excursions after start-up in the waveform of Vsig.

FIG. 18 shows the waveform at junction 188 of the signal, $V_{dif}$.

FIG. 19 shows the waveform of voltage, Vcap, across the capacitor 177.

FIG. 20 shows the waveform of the signal voltage, $V_{\Delta th}$, for enabling switching from the large to the small signal-detector threshold and for enabling AGC.

FIG. 21 shows the waveform of the proximity detector output voltage, Vout.

DESCRIPTION OF PREFERRED EMBODIMENTS

In the following initial discussion of the proximity detector of FIG. 1, it will be assumed that the electronic switch 217 has been removed so comparator 190 and resistors 192, 193, 214 and 215 form a Schmitt circuit with only one single fixed hysteresis. The waveforms shown in FIGS. 2 through 6 pertain to this initial discussion.

Figure 1:
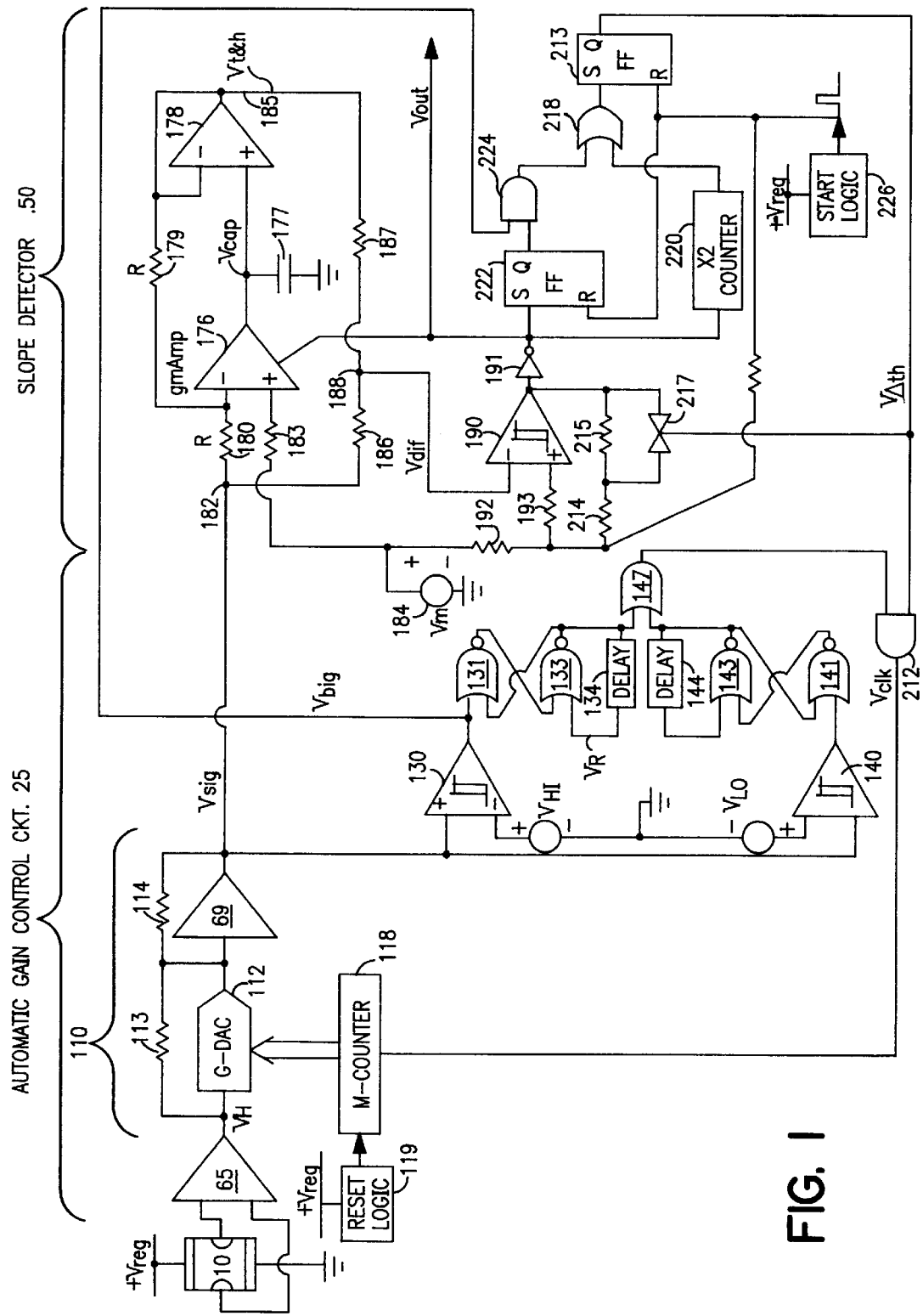
FIG. 1 shows a block diagram of a magnetic-article proximity sensor of this invention.

In the gain controlled proximity detector of FIG. 1, the output of the Hall transducer 10 is connected to the fixed-gain Hall voltage amplifier 65 which is in turn connected to the input of a digitally controllable gain stage 110 composed of a digital-to-analog converter G-DAC 112, two resistors 113 and 114, and an operational amplifier 69. The Hall-voltage amplifier 65, and the controllable amplifier 110 combined with M-counter 118, comprises an AGC circuit 25 that generates the signal Vsig.

The counter 118 is a down counter which is reset to its maximum count by logic block 119 only at the time when the proximity detector is started, namely at proximity-detector start-up when +Vreg is turned on. Counter 118 does not wrap after the unlikely event that the count has reached zero. The positive going transitions in clock signal Vclk are counted by M-counter 118 when enabled via AND gate 212 by the signal $V_{\Delta th}$.

G-DAC 112 is connected internally as a digitally programmable resistor having a maximum resistance when the input count to the DAC is zero. This G-DAC resistor in parallel with resistor 113 sets the total input resistance $R_{in}$ to the operational amplifier 69 at its lowest value when the counter 118 is at maximum count. The gain of this digitally controlled amplifier is $R_{114}/R_{in}$, and at maximum count when $R_{in}$ is at its minimum value the amplifier gain is the greatest.

Figure 2:
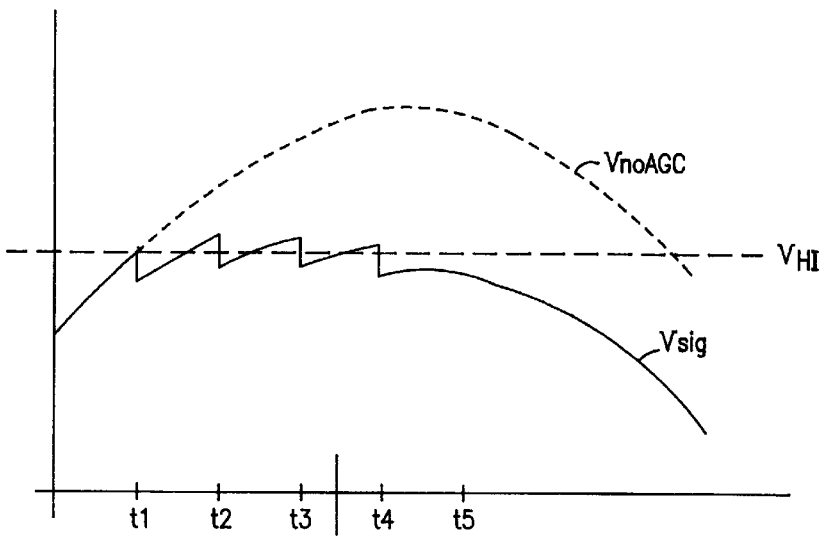
FIGS. 2, 3, 4, 5 and 6 relate to the proximity detector of FIG. 1 and are all drawn to the same time scale.

The amplified Hall voltage Vsig is applied to one input of comparator 130 and a DC reference voltage $V_{HI}$ is connected to the other input of comparator 130. When as illustrated in FIG. 2, a positive excursion in Vsig reaches the reference voltage $V_{HI}$, the signal $V_{big}$ (FIG. 3) at the output of comparator 130 goes high at time $t_1$. Now assuming for the moment that both inputs of AND gate 212 have gone high, the output Vclk (FIG. 4) of the latch of cross-coupled NOR gates 131 and 133 is caused to go high, $V_{clk}$ passes through NOR gate 147 and AND gate 212 and the count in counter 118 decreases by one. AGC action has been initiated. Thus at $t_1$ the resistance of G-DAC 112 goes up by an incremental amount, the gain of amplifier 110 decreases by a corresponding incremental amount and there is an incremental drop in the voltage Vsig that occurs at time $t_1$.

Figure 3:
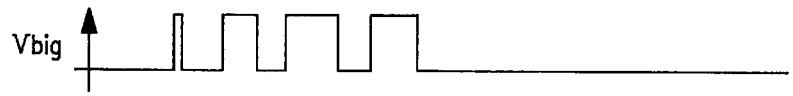
Figure 4:
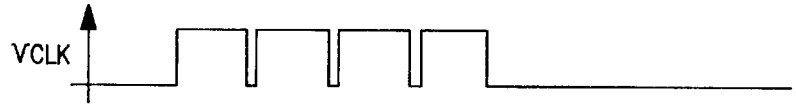
Figure 5:

But the incremental drop in Vsig at $t_1$, puts the amplitude of Vsig below $V_{HI}$, and Vbig almost instantaneously goes low as illustrated in FIG. 3. Thus there is only a narrow high spike in the signal Vbig at $t_1$ as seen in FIG. 3. The signal Vclk passes through the delay circuit 134 (e.g. a 5 μsec delay), and at 5 μsec after $t_1$ the reset input signal $V_R$ (FIG. 5) to NOR gate 133 goes high to reset the NOR gates latch.

Because the gain in amplifier 110 has dropped at $t_1$, Vsig is amplified less after $t_1$. When Vsig again reaches $V_{HI}$, Vbig goes high, but at the output of NOR gate 133 the high, $V_R$ (FIG. 5), holds the latch reset for the time of delay 134 until $t_2$. At time $t_2$ the high in Vbig can set the latch again and drop the gain of the amplifier 110 a second time. This sequence of events is repeated until at time $t_4$, Vsig remains below the reference voltage $V_{HI}$. The dashed curve $V_{noAGC}$ in FIG. 2 shows the waveform of the excursion of Vsig that would have occurred if the gain of the amplifier 110 had remained constant, i.e. there had been no automatic gain control.

Figure 6:
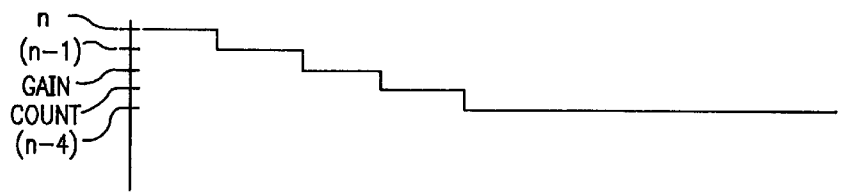

In FIG. 6, n is the gain setting count in counter 118 prior to time $t_1$. Successive counts (n-1) through (n-4) decrease leading to successive decreases in amplifier gain. If the following positive peaks in transducer signal $V_H$ remain the same, the gain setting count in counter 118 will not drop but will be held. It can therefore be appreciated that AGC action will have been substantially terminated during appearance of the very first positive excursion in Vsig after energizing the proximity detector. Any following excursions in Vsig that exceed $V_{HI}$ can trigger more gain reduction (up until the first 64 positive excursions have occurred).

It is not uncommon that magnetic-field-to-voltage transducers produce asymmetrical waveforms. When the positive and negative peaks in Vsig are unequal, it is possible in the proximity detector of FIG. 1, with AGC based on detection of excessively high positive peaks only in Vsig, that negative peaks would be clipped in amplifier 110. Therefore, although the proximity detector of FIG. 1 that controls the gain of Vsig and therefore the amplitude of positive and negative peaks therein, it is preferable to also detect in Vsig when negative peaks are too great.

Toward that end, the AGC circuit additionally includes a negative peak comparator 140, a new fixed DC reference voltage generator $V_{LO}$, another latch of cross-coupled NOR gates 141 and 143, and another delay circuit 144.

These additional components are to provide complementary treatment of gain adjust referenced to the negative going excursions in Vsig. The added OR gate 147 has inputs connected to the outputs of the two cross-coupled latches and produces a composite clock signal Vclk that is applied to the input of the down counter 118.

Now if the first positive excursion in Vsig is greater than $V_{HI}$, the gain is adjusted downward. If a subsequent negative going excursion in Vsig is still less than $V_{LO}$, the gain is further downward adjusted so that the peaks of both polarities in Vsig are within the range of from $V_{LO}$ to $V_{HI}$, and asymmetrical waveforms in $V_H$ of any extreme are quickly brought within the dynamic operating range of the amplifier by the AGC circuit of FIG. 1.

Figure 7:
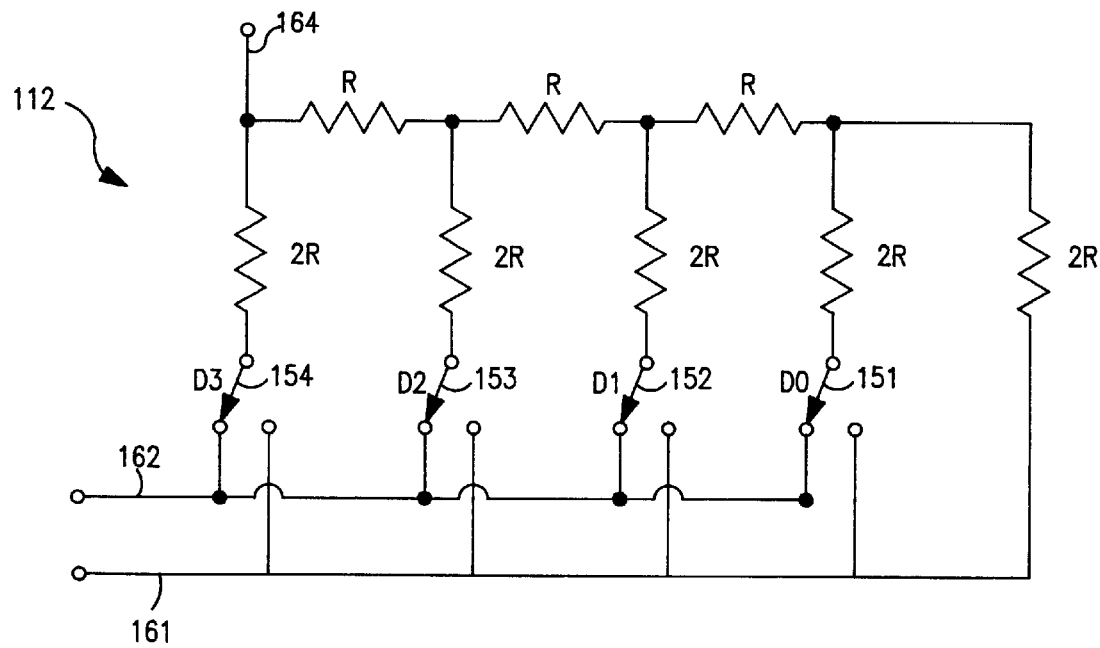
FIG. 7 shows a circuit diagram of an R/2R digital-to-analog converter (DAC).
Figure 8:
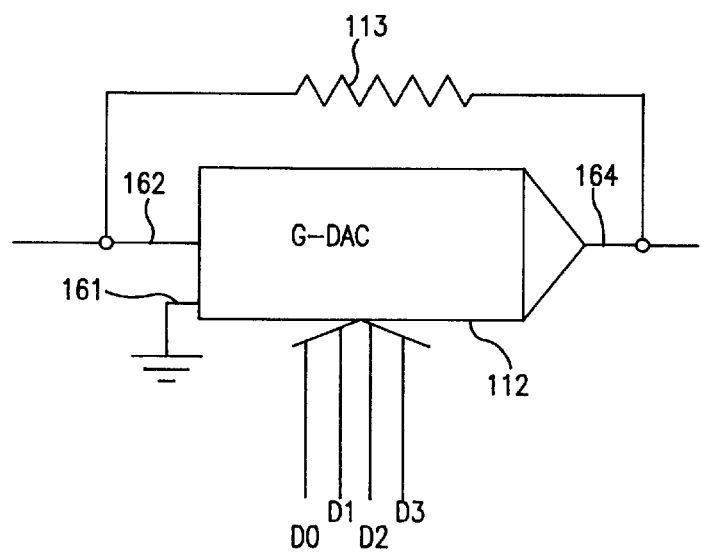
FIG. 8 shows a block diagram 112 of the DAC of FIG. 7 connected as a digitally controllable resistor, such as may be employed as the G-DAC 112 in FIG. 1.

The G-DAC 112 in FIG. 1 serves essentially as a digitally-controllable resistor, and may employ the well known R/2R type DAC connected as shown in FIG. 7. Each of the three resistors shown at the top of FIG. 7 has a resistance R, while the other four resistors have a resistance of 2R. The corresponding external leads of DAC 112 are shown both in the full circuit of FIG. 7 and the block diagrammed DAC 112 in FIG. 8.

A lead 161 is grounded while leads 162 and 164 are connected respectively to the output of the first Hall-voltage amplifier 65 and to the input of the operational amplifier 69. The four switches 151, 152, 153 and 154 represent electronic switches to which are connected the four digit count signal D0, $D_1$, $D_2$ and $D_3$ from the gain counter (e.g. 118). Switches 151, 152, 153 and 154 are shown in the positions wherein all four digits in the input count signal are high and the resistance between leads 162 and 164 is at a minimum value. The paralleling resistor 113 is not essential. Resistor 113 drops the minimum resistance of the paralleled combination at the input of the operational amplifier but more importantly reduces the maximum operational amplifier input resistance, i.e. maximum $R_{in}$.

When grounded the G-DACs become digitally-controllable voltage dividers, and the effective resistance between conductors 162 and 164 becomes essentially a linear function of the digital count to the G-DAC 112 when R is large enough that the resistance between terminals 161 and 162 is much larger than the output impedance of the Hall-voltage amplifier 65. Thus amplifier gain is a linear function of the count.

In the proximity detector circuit of FIG. 1, a peak-referenced-threshold signal detector circuit 50 follows the automatic gain control circuit 25. Compared with the peak-referenced-threshold detector of the above-mentioned patent U.S. Pat. No. 5,442,283, the peak referenced threshold detector 50 uses the same principle of applying the difference voltage between Vsig and a held peak voltage in Vsig to the input of a threshold comparator such as a Schmitt trigger circuit. Signal detector 50 however is quite different, and somewhat simpler, e.g. employing only one instead of two Schmitt trigger circuits.

Peak-referenced-threshold signal detector circuit 50 employs a transconductance amplifier (gmAmp) 176 that generates at its output a current having an amplitude that is commensurate with its differential input voltage. A capacitor 177 is alternately charged and discharged by the output current from amplifier 176. For example when Vsig is decreasing, the capacitor 177 will be charging and the capacitor voltage Vcap will be increasing.

The capacitor voltage Vcap is fed back via buffer amplifier 178 and through feedback resistor 179 (of resistance R) to the negative input of gM-amplifier 176. Junction 182 is connected via resistor 180 (of resistance R) to the negative input of gmAmp 176. This feedback circuit insures that when the capacitor 177 is either charging or discharging, the capacitor voltage Vcap will track Vsig with reversed polarity.

The gmAmp 176 is, as will be seen, energized from only a positive DC supply voltage, +Vreg, and cannot draw down Vcap below ground, i.e. zero volts. However, the positive input of gmAmp 176 is connected via resistor 183 to a positive source 184 of DC voltage Vm, about midway between ground and +Vreg. This results in Vcap being centered at roughly Vreg/2 and Vsig is also so centered within the dynamic range of AGC amplifier 110.

Figure 10:
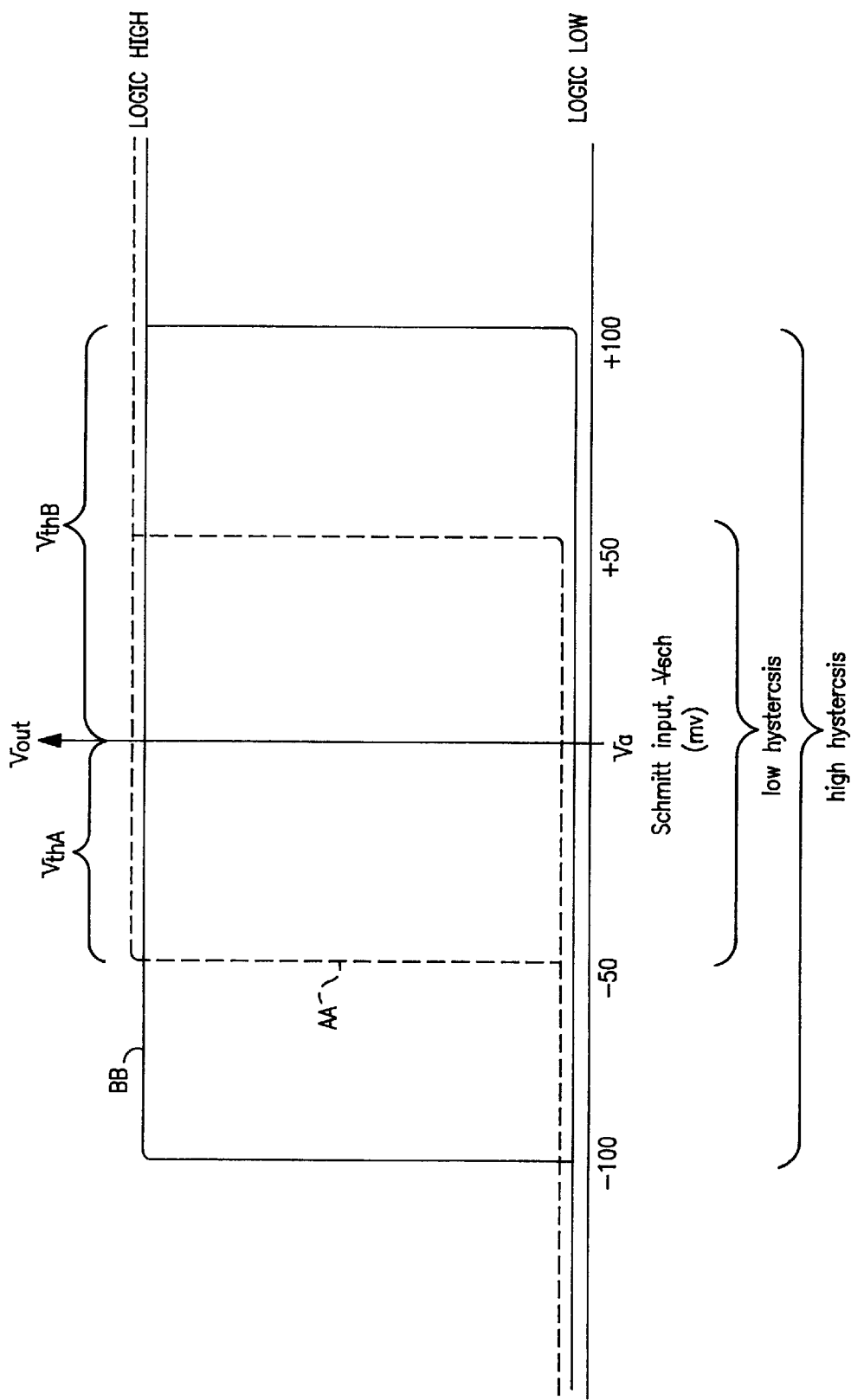
FIG. 10 shows curves AA (dashed) and BB (solid) representing the switchable comparator hysteresis loops corresponding respectively to the two switchable thresholds of the comparator of slope detector 50 in FIG. 1.
Figure 18:
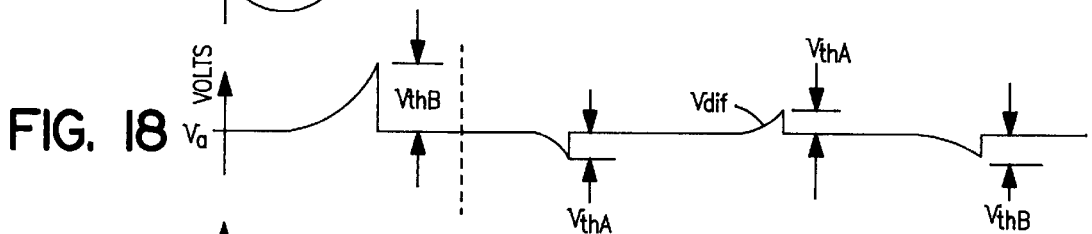

The average voltage level, Va, at node 188 is the reference level in the signal $V_{dif}$ (FIG. 18) and is the center reference level in the hysteresis characteristic of the Schmitt comparator (FIG. 10). Va is set by design to equal Vm.

Figure 9:
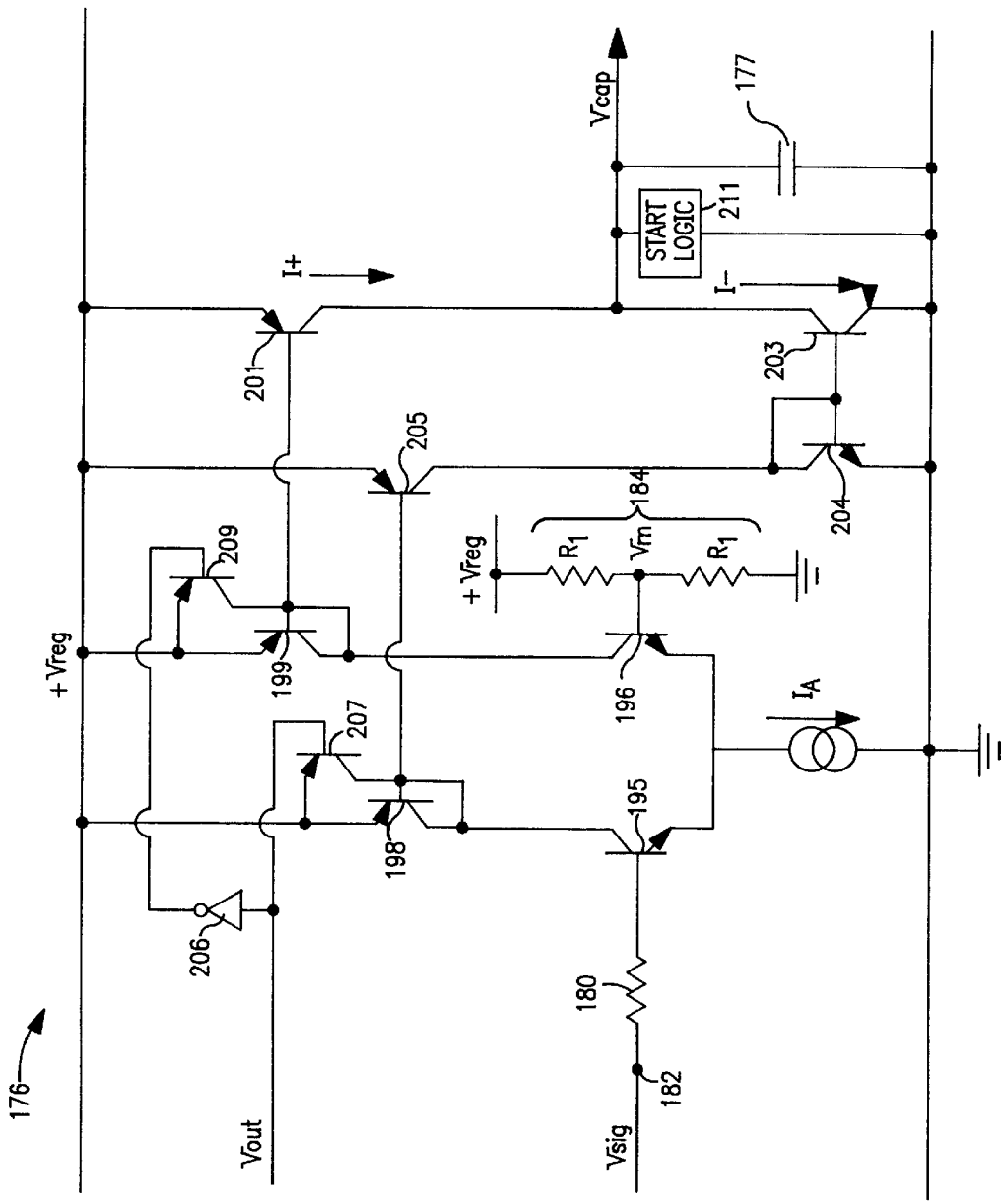
FIG. 9 shows a circuit diagram of the Gm-amplifier 176 employed in the proximity detector of FIG. 1.

With reference to FIGS. 1 and 9, the output signal voltage, $V_{t\&h}$, from buffer amplifier 178 is tied to circuit junction 185 at which the voltage Vcap appears, so that $V_{t\&h}$ equals Vcap. Series connected resistors 186 and 187 serve as a summing circuit and are connected between junctions 185 and 182 to provide a signal $V_{dif}$. Since Vsig is applied to the negative input of gmAmp, Vcap goes lower when Vsig grows more positive. $V_{dif}$ is thus the difference between Vsig at junction 182 and Vcap which is equal to $V_{t\&h}$ at node 185.

$V_{dif}$ at the junction 188 between resistors 186 and 187 is connected to the negative input of a Schmitt trigger circuit that includes the zero-crossing comparator 190 and the hysteresis determining resistors 192, 214 and 215. The positive input of the comparator 190 is connected via resistors 192 and 193 to the voltage source 184. Now when the signal $V_{dif}$ at junction 188 exceeds Va by the magnitude of the Schmitt threshold voltage $V_{th}$, the output signal Vout from the invertor 191 goes high. When the signal $V_{dif}$ at junction 188 falls below Va by the Schmitt threshold voltage, $V_{th}$, then Vout goes low. The signal at junction 188 is developed as follows.

Referring to FIG. 9, the circuit of the gmAmp 176 has a differential input stage of transistors 195 and 196 that ration the current $I_A$ between the current-source diodes 198 and 199 respectively. Vsig is applied at junction 182 to the base of transistor 195 via resistor 180. The current I+ in transistor 201, for charging capacitor 177, mirrors the current through diode 199. The current I− in transistor 203, for discharging capacitor 177, mirrors the current through diode 204 and via transistor 205 mirrors the current through diode 198.

Figure 21:
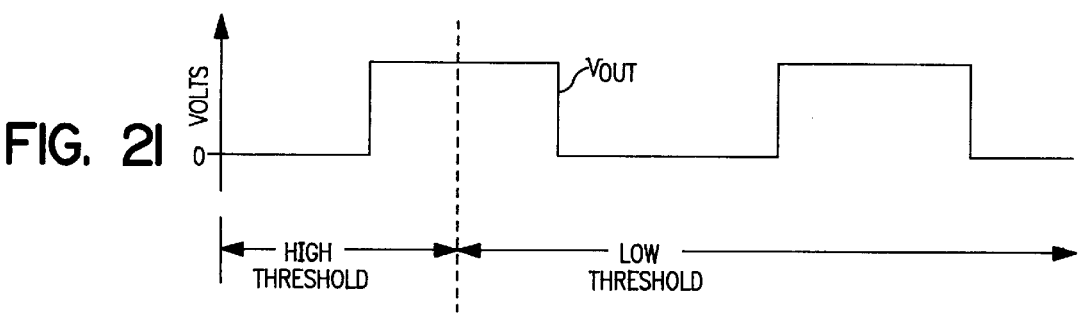

In FIG. 1, Vout from invertor 191 is seen to be the binary output signal of the entire proximity detector that has transitions at times $t_x$, i.e. at times $t_1$, $t_2$, etc., as in FIG. 21. This binary signal, Vout, is seen in FIG. 9 to be applied directly to the base of transistor 207, and applied via invertor 206 to transistor 209. Transistors 207 and 209 are alternately turned on by the signal Vout, applied to the gmAmp 176 so as to alternately hold off (and on) transistors 201 and 203 respectively. Therefore currents I+ and I− are never on at the same time.

At start-up, the capacitor voltage Vcap is briefly discharged and set to near zero voltage by the start logic 211, and capacitor 177 can then only be charged by a current I+.

Figure 17:
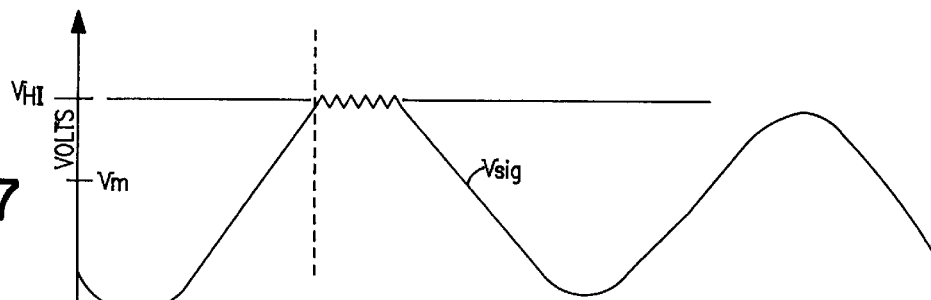
FIGS. 17, 18, 19, 20 and 21 are waveforms in the proximity detector of FIG. 1 that represent the condition in which Vsig at start-up is large enough to actuate AGC. These five waveforms are drawn to the same time scale.
Figure 19:
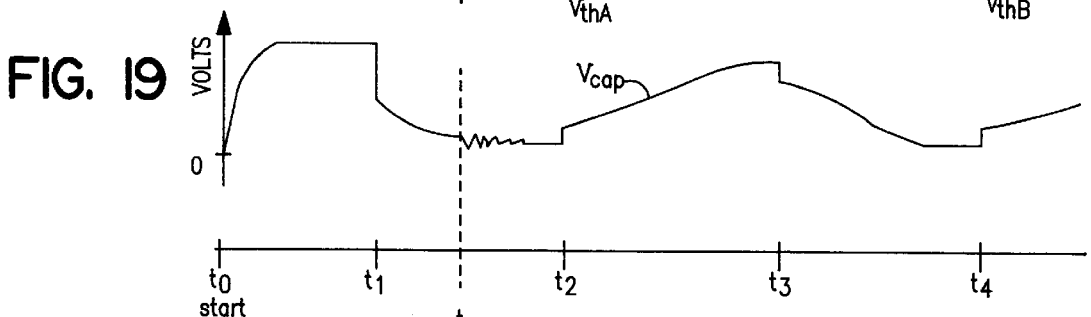

If at start-up, Vsig is decreasing toward a negative peak, as seen in FIG. 17, then as seen in FIG. 19, Vcap increases. Vcap increases until Vsig reaches the negative peak and thereafter holds the corresponding Vcap voltage at that level until, at the time $t_1$, when Vsig has increased to a value that is greater than the held Vcap voltage by an amount equal to the hysteresis $V_{th}$ of the Schmitt-trigger comparator 190.

$V_{dif}$, at junction 188 FIG. 1, is the difference voltage between signals appearing at junctions 182 and 185, and the positive going pulse in $V_{dif}$ at $t_1$, (FIG. 18) is applied to the negative input of the comparator 190 that results in a positive transition in the binary signal Vout (FIG. 21).

As noted above, Vout goes high when the signal $V_{dif}$ falls below Va by the Schmitt threshold voltage, $V_{th}$ at time $t_1$. I− is set and held at zero from start-up to time $t_1$. At time $t_1$ Vout goes from a low to a high binary level, a positive transition, and then I− is turned on and discharges capacitor 177 to drop Vcap to the current $t_1$ value of Vsig. Vcap is then caused to track Vsig with inverse polarity until the positive peak in Vsig has occurred.

Vcap subsequently holds the corresponding lowest value (negative peak value) until at time $t_2$, Vsig has at time $t_2$ decreased to a value below the held Vcap voltage by an amount equal to the (still assumed fixed) hysteresis $V_{th}$ of the Schmitt-trigger comparator 190, causing the Schmitt output from comparator 190 to go high and Vout (FIG. 21) to go low.

The Advantage in a Proximity Detector of a Dual Hysteresis Feature

Figure 20:
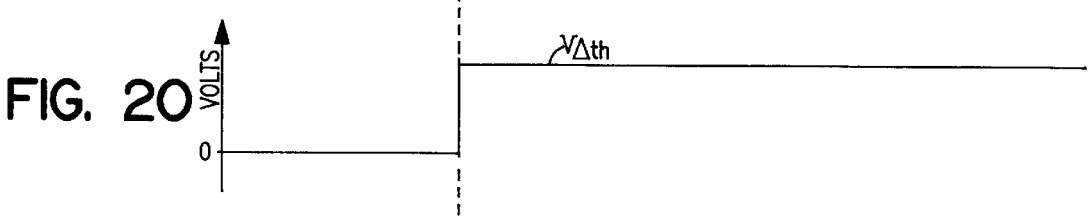

Assume that the first positive excursion in Vsig exceeds $V_{HI}$. Before time $t_2$, Vsig reaches $V_{HI}$ and initiates AGC action at time $t_{Ath}$, which then truncates the positive peak in Vsig while reducing the gain so that any following positive peak in Vsig will have an amplitude of $V_{HI}$, obviating further AGC action at such positive peaks. When Vsig first reaches $V_{HI}$, $V_{big}$ goes high at the input of AND gate 224. After $t_1$, Vout is already high and so at time $t_{Ath}$ the output of AND gate 224 goes high setting latch 213 via OR gate 218 and producing a high in signal $V_{Ath}$ as seen in FIG. 20. The output of the AGC OR gate 147 is repeatedly sent high during a brief AGC action, which action is enabled by AND gate 212 when the signal $V_{Ath}$ is high.

Figure 11:
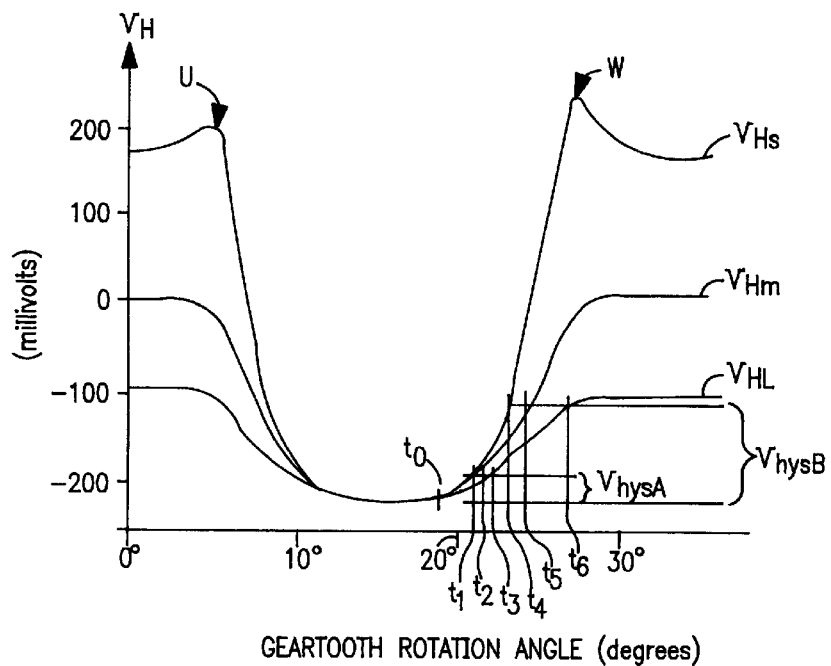
FIG. 11 shows superimposed three waveforms of $V_H$, in the proximity detector of FIG. 1 corresponding respectively to three air gap spacings.

FIG. 11 shows waveforms $V_{Hs}$, $V_{Hm}$ and $V_{HI}$ respectively for a small, a medium- and a large-dimension air gap using a proximity detector without an AGC feature and without a dual-threshold-mode signal detector. But the waveforms of FIG. 11 may also truly represent Vsig in FIG. 1 with the AGC feature disabled. When a gear tooth is closely adjacent to the Hall transducer, these waveforms are positive and include two spikes U and W corresponding respectively to the leading and retreating edge of the gear tooth. The negative-going portions of the waveforms correspond to the valleys between the gear teeth and have no such spikes. As seen in FIG. 11, the slopes of $V_H$ decrease at larger air gaps.

Figure 12:
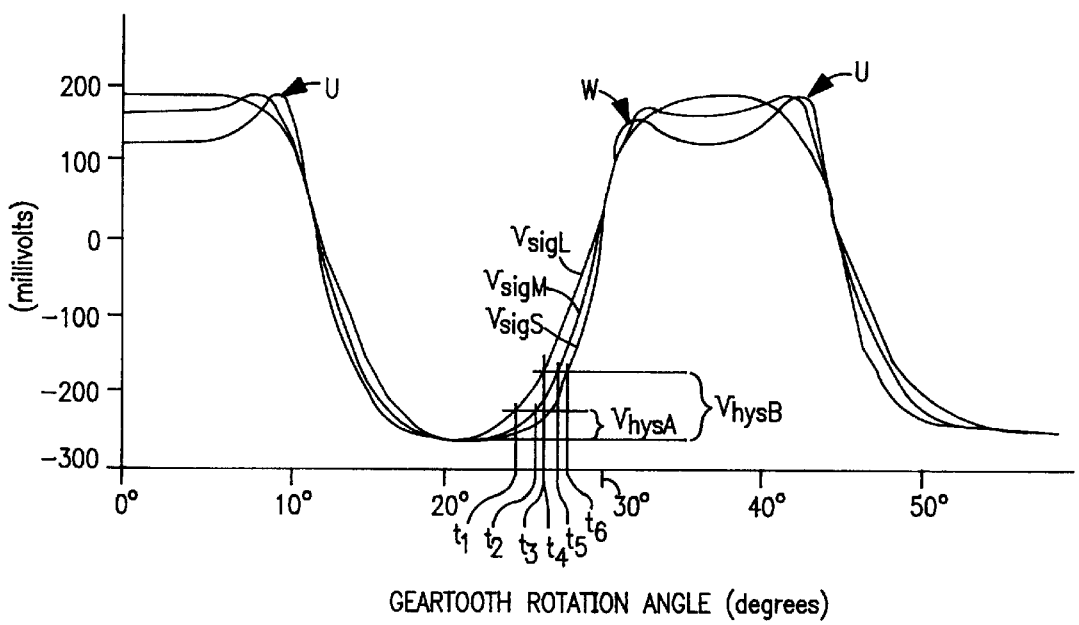
FIG. 12 shows superimposed three waveforms of $V_H$ corresponding to three air gap spacings in the proximity detector of FIG. 1 with the AGC circuit enabled.

In FIG. 12, the three signals $V_H$ have been amplified by an AGC amplifier that renders their amplitudes equal. The three amplified signals are labeled $V_{sigS}$, $V_{sigM}$ and $V_{sigL}$, and correspond respectively to the same small, medium and large air gaps.

Improved accuracy results from use of a transducer-signal amplifier having an AGC capability, as is seen by comparing the smaller spread in detection times as a function of air gap in FIG. 11 relative to that in FIG. 12. Here it is seen that when the fixed hysteresis threshold of the signal detector is a little one, $V_{HysA}$, the accuracy of detecting peak negative excursions in Vsig is better yet with AGC. Whether or not there is AGC, when the comparator hysteresis is a large one, e.g. $V_{HysB}$, the degrees of gear rotation between $t_0$ and the times of detection $t_4$, $t_5$ and $t_6$ are seen to be larger and more spread out as a function of air gap than for a small detection threshold $V_{thA}$, with or without AGC.

It can now be appreciated why a small hysteresis is preferred as providing enhanced accuracy. It is also seen here how AGC improves detection accuracy. The possibility is seen here too, that detection accuracy would be obtainable over a wider range of air gaps if the detection threshold could be changed to accommodate different air gaps.

However, another source of detection inaccuracies needs accounting for. The shape of the positive peak in Vsig, when as here the positive peak corresponds to the top of a gear tooth, tends to include overshoot or spike portions U and W, especially when the air gap is small. These overshoot or spike portions are henceforth referred to as "overshoots".

Two overshoots U and W of each positive excursion in Vsig correspond respectively to the transition from the leading side of an approaching tooth to the top flat of the tooth, and to the transition from the flat of the tooth to the retreating side of the tooth. The overshoots become more prominent for smaller air gap dimensions.

Figure 13:
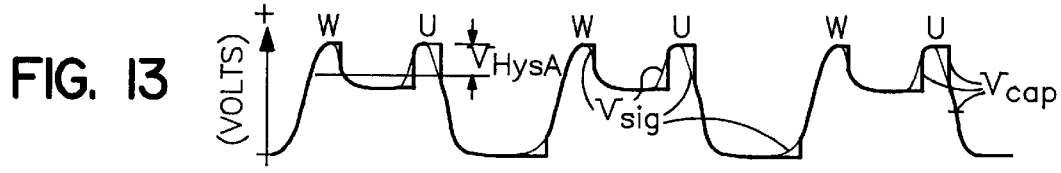
FIG. 13 shows the waveforms of Vcap (heavy line) and corresponding Vsig (thin line where not obscured) with overshoots that are greater than the hysteresis of the signal-detector comparators in FIG. 1.

We have found that the problem of accurate detection of the approach of passing magnetic articles is still confounded by the existence of overshoots whenever the air gap is small. When the detection hysteresis is small, such overshoots cause false indications of a passing article. For instance, when the hysteresis is smaller than an overshoot, as in FIG. 13, the peak voltage of the leading overshoot U in a positive excursion of Vsig is held until Vsig drops by the amount of the hysteresis and triggers a "false retreating gear tooth" transition in the detector output voltage Vout as shown in FIG. 13.

Figure 15:
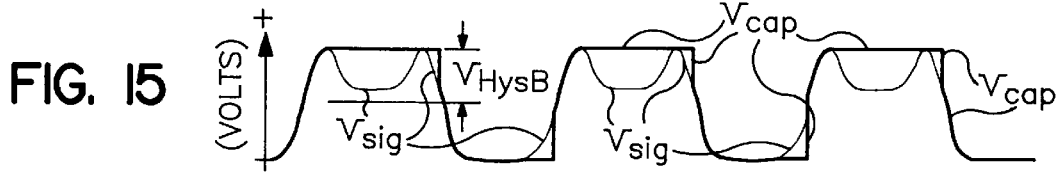
FIG. 15 shows the waveforms of Vcap in the proximity detector of FIG. 1 wherein the hysteresis of the comparator is greater than the overshoots in Vsig.
Figure 16:
FIG. 16 shows a waveform of the output voltage Vout under the conditions indicated in FIG. 15.

The second overshoot W is then initially treated by the detector as a second positive excursion in Vsig indicating falsely that two gear teeth had passed when there was actually only one. That situation may be resolved by increasing the magnitude of the hysteresis beyond that of the overshoots, as is illustrated in FIGS. 15 and 16.

But more importantly, the relative amplitudes of overshoots compared to that of the entire transducer signal $V_H$ are very high for small air gap dimensions and approaches zero for large air gaps. This means that the proximity detector must start before sensing whether there exists a large air gap or a small air gap. The AGC feature will, quickly at starting, produce a signal Vsig that is of a desired amplitude, but it may include large overshoots or none at all. As will be seen, this problem is solved by the dual hysteresis feature of this invention. How the dual hysteresis feature operates in the proximity detector of FIG. 1 is described later herein.

Figure 14:
FIG. 14 shows the waveform of the output voltage Vout under the conditions represented in FIG. 13.

The Proximity Detector of FIG. 1 with AGC Enabled and Dual Hysteresis Feature Enabled In order to eliminate false pulses, e.g. pulse 165 in FIG. 14, attributable to Vsig overshoots in the proximity detector circuit of FIG. 1, a circuit is provided for switching between the dual comparator thresholds. This is done by switching between a small hysteresis and a large hysteresis of the signal-detector comparator (comprised of comparator 190, resistors 214 and 215, and the bi-directional switch 217).

Referring to the waveforms in FIGS. 17 through 21, when at time $t_{\Delta th}$ Vsig exceeds $V_{HI}$ and the latch 213 output signal $V_{\Delta th}$ goes high, the AGC circuit is enabled and simultaneously switch 217 opens and changes the hysteresis of the signal-detector comparator circuit from a large (designated $V_{thB}$) to a small (designated $V_{thA}$) threshold value. The feedback resistors 214 and 215 connected across the output of the zero-crossing comparator 190 and the resistors 192 and 193, determine the Schmitt trigger threshold.

Thus, subsequent to time $t_{\Delta th}$, the AGC truncated portion of Vsig causes Vcap to hold the corresponding level until signal voltage Vsig turns downward and $V_{dif}$ becomes negative enough at time $t_2$ to trip the Schmitt trigger circuit that now has a small threshold $V_{thA}$.

In the foregoing description corresponding to FIGS. 17 through 21, start-up occurred at a moment when Vsig was going negative and subsequently exceeded $V_{HI}$, and in that situation the output signal $V_{\Delta th}$ waits to enable the AGC circuit 25 and waits to enable a change in hysteresis of the Schmitt trigger circuit until the first positive excursion in Vsig when Vbig is simultaneously high.

At the count of two positive excursions in Vout by the 2× counter 220 the counter output goes high, but if latch 213 had been earlier set before $t_2$ when AGC was initiated, this has no effect.

If no positive excursions in Vsig exceed $V_{HI}$, then $V_{big}$ never goes high and there will be no AGC action. In this case, automatic threshold switching will still occur.

When Vsig is small enough that its excursions do not exceed $V_{HI}$, then no AGC action will be initiated. The Schmitt comparator continues to operate with the large threshold $V_{thB}$ at the following times $t_2$ and $t_3$, since $V_{big}$ remained in the low binary state and the output of AND gate 224 remains in the low state. However, the ×2 counter 220 has been counting the positive transitions in Vout, and at $t_4$ produces in signal $V_{\Delta th}$ a binary high to set latch 213, and the detector is switched from the large ($V_{thB}$) threshold to the small threshold ($V_{thA}$). Start logic 226 provides a narrow pulse, only at start-up to reset counter 220 to zero count. Start logic also initially sets the threshold of the Schmitt circuit to the large threshold $V_{thB}$, and resets latches 213 and 222. At time $t_3$, the Schmitt threshold is still large, $V_{thB}$, and at time $t_3$, counter 220 produces a high output to OR gate 218 which sets latch 213 and produces transition to a high binary level in $V_{\Delta th}$ that opens switch 217. Thus at time $t_4$ and at times thereafter, the signal $V_{dif}$ has small positive and negative excursions equal to the small hysteresis threshold $V_{thA}$.

The large threshold $V_{thB}$ is always set at start-up. When during the initial interval (composed of the first positive and first negative excursion in Vsig) after start-up, Vsig exceeds $V_{HI}$, then the Schmitt comparator is switched to the small threshold, $V_{thA}$. Alternatively, when during the initial interval after start-up, Vsig does not exceed $V_{HI}$, then the small Schmitt threshold, $V_{thA}$, is switched in when the output of counter 220 goes high at time $t_4$, or more generally before the first five excursions in Vsig have transpired. Therefore, the Schmitt threshold is under all conditions switched to the small value $V_{thA}$ before the first five excursions in Vsig have transpired.

The high initial AGC amplifier gain assures that when the passing articles are passing at a substantial distance with respect to the transducer the resulting small signal $V_H$ will still provide a signal Vsig that is large enough to be detected.

The large initial threshold $V_{thB}$ assures that when the passing articles are passing at a very small distance with respect to the transducer the resulting large signal $V_H$ with large overshoots will not produce false detection indications in Vout. And the low threshold $V_{thA}$, which always is used after at most the four initial excursions in Vsig, guarantees high detection accuracy for all of the rest of the detecting thereafter.

Alternative Constructions

The digitally-gain-controllable amplifier based upon use of G-DAC 112 may alternatively be based upon an operational amplifier with an input and a feedback resistor, wherein there is substituted for the input resistor a group of parallel connected branch circuits, each containing a resistor and a binary-signal controllable switch for digitally controlling the resistance of the input resistor.

As noted, the purpose of effecting automatic gain adjustment for only a few (e.g. 2) of the first excursions in Vsig is to avoid subsequent quick shifts in the actual distance of approaching articles at which a corresponding transition in Vout occurs. In applications such as ignition distributors, the timing of engine firing tends to cause small but annoying jumps in engine power delivery.

However, it is easily possible to periodically re-start the AGC process, maybe every minute or so, or after a predetermined number of detected articles have passed by. For example, the count held in the AGC M-counter 118 could be periodically increased by a predetermined number.

Of course continuous gain adjustment is another option, e.g. by removing the AND gate 212 and permanently connecting the output of OR gate 147 directly to the input of M-counter 118.

It is also possible to digitally control the exciting current in the Hall element for effecting AGC of the composite transducer, e.g. by using a digitally controlled voltage regulator that is used for energizing the Hall element.

In the embodiment described above, the signal $V_{big}$ goes high only when a positive excursion in Vsig exceeds $V_{HI}$. Alternatively, the signal $V_{big}$ could have been caused to go high when a negative excursion in Vsig exceeds $V_{LO}$, which would then enable AGC action and enable switching to the small detector threshold $V_{thA}$ as described above.

We claim:

1. A proximity-detection method for detecting the passing of magnetic articles comprising:

a) employing a magnetic-field-to-voltage transducer near the passing magnetic articles, sensing an ambient magnetic field and applying the output voltage of said transducer $V_H$ to an amplifier, and generating from the output from said amplifier a voltage Vsig that is directly related to the proximity of the articles that may be passing;

b) generating a binary proximity-detector output voltage Vout by generating a track-and-hold signal voltage, $V_{t\&h}$, that tracks each slope portion of Vsig until a peak excursion is reached and holds the peak excursion voltage until at a time $t_x$ the difference voltage, $V_{dif}$, between Vsig and $V_{t\&h}$ reaches the threshold voltage of a switchable dual-threshold signal detector, and at successive times $t_x$ producing from said signal detector the successive binary transitions in Vout of one and the other polarities corresponding respectively to a time $t_x$ following a positive excursion in Vsig and a time $t_x$ following a negative excursion in Vsig;

c) defining an initial interval in which only the first positive and first negative excursions in Vsig transpire after start-up of the detecting;

d) setting said dual-threshold signal detector at start-up of the proximity detecting to the larger ($V_{thB}$) of the two threshold voltages; and e) when during the initial interval, the excursion of one polarity in Vsig becomes greater than the predetermined reference voltage ($V_{HI}$), switching said dual-threshold signal detector to the smaller ($V_{thA}$) of the two threshold voltages.

2. The proximity-detection method of claim 1 additionally comprising changing the gain of said amplifier in the direction to bring the peak values of one polarity in Vsig to a predetermined target value ($V_{HI}$).

3. The proximity-detection method of claim 1 additionally comprising at start-up, setting the initial gain of said amplifier to a maximum gain value, and during the initial interval after start-up, decreasing the amplifier gain until the peak value of the first excursion of one polarity in Vsig is brought to a predetermined target value ($V_{HI}$).

4. The proximity-detection method of claim 3 wherein the decreasing the amplifier gain is accomplished by decreasing the gain of said AGC amplifier by predetermined gain increments at a rate more than an order of magnitude greater than the frequency of the excursions in Vsig until that first peak is flattened to essentially equal the reference voltage ($V_{HI}$).

5. The proximity-detection method of claim 1 wherein the predetermined gain increments are less than ten percent of the maximum gain of the AGC amplifier.

6. The proximity-detection method of claim 1 additionally comprising when during the initial interval the excursion of one predetermined polarity in Vsig does not become greater than a predetermined reference voltage, ($V_{HI}$), then in a second interval during which two more excursions in Vsig have transpired, switching said dual-threshold signal detector to the smaller ($V_{thA}$) of the two threshold voltages.

* * * * *